(12) United States Patent
Klein et al.

(10) Patent No.: US 10,743,375 B2
(45) Date of Patent: Aug. 11, 2020

(54) PANE ASSEMBLY HAVING A HEATABLE COMPOSITE PANE HAVING A CAPACITIVE SWITCHING REGION

(71) Applicant: SAINT-GOBAIN GLASS FRANCE, Courbevoie (FR)

(72) Inventors: Marcel Klein, Baesweiler (DE); Stefan Droste, Herzogenrath (DE); Patrick Weber, Alsdorf (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 280 days.

(21) Appl. No.: 15/740,801

(22) PCT Filed: Nov. 7, 2016

(86) PCT No.: PCT/EP2016/076891
§ 371 (c)(1),
(2) Date: Dec. 28, 2017

(87) PCT Pub. No.: WO2017/077133
PCT Pub. Date: May 11, 2017

(65) Prior Publication Data
US 2018/0192477 A1 Jul. 5, 2018

(30) Foreign Application Priority Data
Nov. 6, 2015 (EP) .................... 15193393

(51) Int. Cl.
*H05B 3/86* (2006.01)
*B32B 17/10* (2006.01)
*H03K 17/96* (2006.01)

(52) U.S. Cl.
CPC ......... *H05B 3/86* (2013.01); *B32B 17/10036* (2013.01); *B32B 17/10174* (2013.01);
(Continued)

(58) Field of Classification Search
CPC ............... H05B 3/86; B32B 17/10036; B32B 17/10174; B32B 17/10385;
(Continued)

(56) References Cited

U.S. PATENT DOCUMENTS 3,995,140 A  11/1976 Kuiff et al.
4,196,338 A  4/1980 Edel
(Continued)

FOREIGN PATENT DOCUMENTS

DE   10126869 A1   12/2002
DE   202006006192 U1   7/2006
(Continued)

OTHER PUBLICATIONS

International Search Report for International Application No. PCT/EP2016/076891 filed Nov. 7, 2016 on behalf of Saint-Gobain Glass France. dated Jan. 19, 2017, 7 pages. (German + English Translation).

*Primary Examiner* — Benjamin R Shaw
(74) *Attorney, Agent, or Firm* — Pillsbury Winthrop Shaw Pittman LLP

(57) ABSTRACT

A pane arrangement directed to a heatable composite pane having a capacitive switching region, including a substrate and a cover pane is disclosed. At least one intermediate layer is arranged between the substrate and the cover pane. A carrier film having an electrically conductive layer is arranged between the substrate and the intermediate layer or between the cover pane and the first intermediate layer. The electrically conductive layer forms a capacitive switching region having a contact region, a supply line region, and a connection region. The supply line region electrically connects the contact region to the connection region that can be electrically connected to a sensor electronics system. A heating wire and at least two busbars are arranged between the substrate and the cover pane, wherein one end of the (Continued)

Figure 1A:
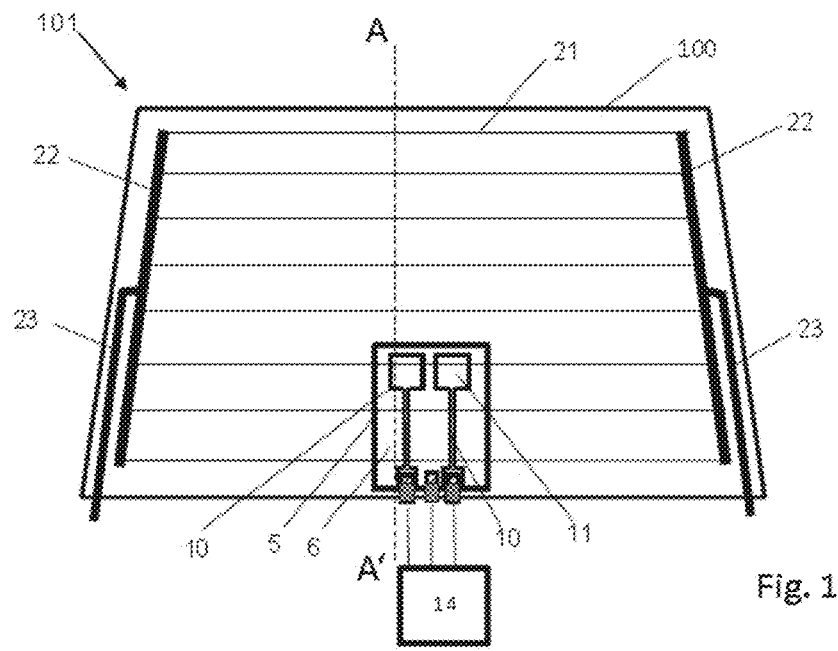

heating wire is electrically connected to one of the busbars. A capacitive sensor electronics system is electrically connected to the connection region via a first input and to the heating wire or to the busbars via a second input.

19 Claims, 6 Drawing Sheets

(52) U.S. Cl.
CPC .. *B32B 17/10385* (2013.01); *B32B 17/10761* (2013.01); *H03K 17/962* (2013.01); *B32B 17/10779* (2013.01); *B32B 2605/006* (2013.01)

(58) Field of Classification Search
CPC ........ B32B 17/10761; B32B 17/10779; B32B 2605/006; H03K 17/962
USPC ........................................................ 219/203
See application file for complete search history.

(56) References Cited

U.S. PATENT DOCUMENTS

| | | | |
|---|---|---|---|
| 4,805,070 A | 2/1989 | Koontz et al. | |
| 6,452,514 B1* | 9/2002 | Philipp | G01D 5/2405 |
| | | | 178/18.06 |
| 8,907,250 B2 | 12/2014 | Bressand et al. | |
| 2002/0045037 A1 | 4/2002 | Boire et al. | |
| 2004/0159645 A1* | 8/2004 | Gillner | B32B 17/10761 |
| | | | 219/203 |
| 2007/0194216 A1* | 8/2007 | Schwenke | H05B 1/0236 |
| | | | 250/221 |
| 2009/0014426 A1 | 1/2009 | Baumler | |
| 2010/0179725 A1 | 7/2010 | Boote et al. | |
| 2011/0139756 A1 | 6/2011 | Raible et al. | |
| 2013/0075383 A1* | 3/2013 | Kim | H05B 3/12 |
| | | | 219/203 |
| 2014/0151355 A1* | 6/2014 | Lisinski | B32B 17/1077 |
| | | | 219/203 |
| 2017/0034875 A1* | 2/2017 | Weber | H05B 3/06 |
| 2017/0041987 A1* | 2/2017 | Weber | B32B 17/10761 |
| 2017/0317399 A1* | 11/2017 | Droste | H01Q 1/1278 |
| 2019/0018366 A1* | 1/2019 | Weber | B60R 11/00 |

FOREIGN PATENT DOCUMENTS

| | | |
|---|---|---|
| DE | 202008017611 U1 | 4/2010 |
| EP | 0899882 A1 | 3/1999 |
| EP | 0847965 B1 | 10/2004 |
| EP | 1515211 A1 | 3/2005 |
| EP | 2139049 A1 | 12/2009 |
| EP | 2200097 A1 | 6/2010 |
| JP | S52-050417 B2 | 12/1977 |
| JP | 2001-176644 A | 6/2001 |
| JP | 2002-057518 A | 2/2002 |
| KR | 10-2012-0099331 A | 9/2012 |
| RU | 2352667 C1 | 4/2009 |
| RU | 2394399 C2 | 7/2010 |
| SU | 610479 A3 | 6/1978 |
| WO | 2005/055667 A1 | 6/2005 |
| WO | 2012/052315 A1 | 4/2012 |
| WO | 2015/162107 A1 | 10/2015 |
| WO | 2015/162108 A1 | 10/2015 |

\* cited by examiner

PANE ASSEMBLY HAVING A HEATABLE COMPOSITE PANE HAVING A CAPACITIVE SWITCHING REGION

CROSS REFERENCE TO RELATED APPLICATIONS

The present application is the U.S. National Stage of International Patent Application No. PCT/EP2016/076891 filed on Nov. 7, 2016 which, in turn, claims priority to European Patent Application No. 15193393.4 filed on Nov. 6, 2015.

The invention relates to a pane arrangement having a heatable composite pane having a capacitive switching region, a method for production thereof, and use thereof.

Composite panes typically comprise two panes, for example, an outer pane and an inner pane that are bonded together via an intermediate layer, made, for example, of a thermoplastic polyvinyl butyral (PUB) film. Electrically heatable composite panes are, for example, equipped with heating wires and are frequently used in automotive engineering, for example, as a side window pane, as is known from DE10126869A1 or WO2005055667A2. The heating wires are embedded in the surface of the thermoplastic intermediate layer. Typically, busbars are provided for the electrical contacting of the heating wires. Suitable busbars are, for example, strips of a copper foil that are connected to an external voltage source. The heating wires run between the busbars such that after application of an electrical voltage, an electrical current can flow through the heating wires, by which means the heating action is obtained.

It is known that switching regions can be formed by a surface electrode or by an arrangement of two coupled electrodes, for example, as capacitive switching regions. When an object approaches the switching region, the capacitance of the surface electrode against ground or the capacitance of the capacitor formed by the two coupled electrodes changes. The capacitance change is measured by a circuit arrangement or a sensor electronics system and when a threshold value is exceeded, a switching signal is triggered. Circuit arrangements for capacitive switches are known. for example, from DE 20 2006 006 192 U1, EP 0 899 882 A1, U.S. Pat. No. 6,452,514 B1, and EP 1 515 211 A1.

The object of the present invention consists in providing an improved heatable composite pane having a capacitive switching region that can be simply and economically integrated into the composite pane and that hinders vision through the pane only slightly or not at all. A contact sensor can be formed in a simple manner with the capacitive switching region. The object of the present invention is accomplished according to the invention by a pane arrangement having a heatable composite pane having a capacitive switching region in accordance with the independent claim 1. Preferred embodiments emerge from the subclaims.

The composite pane is preferably a vehicle pane such as a side pane, a windshield, a rear window, or a roof panel. The composite pane according to the invention can, however, also be an architectural pane or a glazing in furniture, for example, a refrigerator, a freezer, or an electric heater or mirror element.

The composite pane is preferably a side pane for an openable side window of a vehicle. This means a side window that can be opened and closed again by substantially vertical displacement of the side pane into the vehicle door.

The composite pane and in particular the side pane has an upper edge, a lower edge, a front edge, and a rear edge. In the case of a side pane, "upper edge" denotes the side edge of the side pane that points upward in the installed position. "Lower edge" denotes the side edge that points downward toward the ground in the installed position. "Front edge" denotes the side edge that is directed forward in the driving direction. "Rear edge" denotes the side edge that is directed toward the rear in the driving direction.

In the pane arrangement, the composite pane according to the invention with a capacitive switching region includes at least the following characteristics:
- a substrate and a cover pane as well as
- at least one first intermediate layer that is arranged areally between the substrate and the cover pane, wherein
- a carrier film having an electrically conductive layer is arranged at least in sections
- between the substrate and the first intermediate layer or between the cover pane and the first intermediate layer,
- at least one region of the electrically conductive layer forms a capacitive switching region,
- the capacitive switching region has a contact region, a supply line region, and a connection region, the supply line region electrically connects the contact region to the connection region, and the connection region can be electrically connected to a sensor electronics system, and
- at least one heating wire and at least two busbars are arranged between the substrate and the cover pane, wherein in each case, one end of the heating wire is electrically conductingly connected to, in each case, one of the busbars, such that upon application of an electrical voltage to the busbars, a heating current can flow through the heating wire, whereby the heating wire can be heated.

The composite pane is heatable through the heatability of the heating wires.

In an advantageous embodiment of the invention, the second input of the sensor electronics system is connected to an electrical ground.

In an advantageous embodiment of the invention, the capacitive switching region overlaps, in projection through the composite pane, with at least one heating wire.

In an advantageous embodiment of the invention, the ratio of length $l_z$ to width $b_z$ of the supply line region is less than or equal to 1:700 and preferably from 1:1 to 1:100. In the context of the present invention, if the supply line region does not have a constant width $b_z$, for example, when it is implemented in a trapezoidal shape or a drop shape, the term "width $b_z$" means the averaged width of the supply line region.

The length $l_z$ of the supply line region is preferably from 1 cm to 70 cm and particularly preferably from 3 cm to 8 cm. The width $b_z$ of the supply line region is preferably from 0.5 mm to 10 mm and particularly preferably from 0.5 mm to 2 mm. The supply line region preferably has the shape of a rectangle, strip, or line.

In an advantageous embodiment of the composite pane according to the invention, the connection region is arranged at the outer edge of the pane. Here, the distance from the outer edge is preferably less than 10 cm, particularly preferably less than 0.5 cm. This makes it possible to conceal an electrical contacting of the connection region, for example, with a foil conductor, under a visually inconspicuous black print or with a cover, for example, a camera housing.

In an advantageous embodiment of the switching region according to the invention, the contact region has an area of 1 cm$^2$ to 200 cm$^2$, particularly preferably of 1 cm$^2$ to 9 cm$^2$. The length $l_B$ of the contact region is preferably from 1 cm to 14 cm and, particularly preferably from 1 cm to 3 cm. The maximum width $b_B$ of the contact region is preferably from 1 cm to 14 cm and particularly preferably from 1 cm to 3 cm. The contact region can, in principle, have any desired shape. Particularly suitable contact regions are circular, elliptical, or drop-shaped. Alternatively, angled shapes are possible, for example, triangles, squares, rectangles, trapezoids, or other types of quadrilaterals or higher order polygons.

In another advantageous embodiment of the switching region according to the invention, the ratio of the width $b_z$ of the supply line region to the maximum width $b_B$ of the contact region is at least 1:2 and in particular at least 1:10. Thus, it was possible to obtain particularly good switching results.

In an advantageous embodiment of the pane according to the invention, the width $t_1$ of the separation lines is from 30 µm to 200 µm and preferably from 70 µm to 140 µm. Such thin separation lines enable reliable and adequately high electrical isolation and, at the same time, disrupt vision through the composite pane only slightly or not at all.

The switching region is a capacitive switching region, in other words, it is specially implemented for capacitive contact detection. In an advantageous embodiment, the switching region forms a surface electrode. The capacitance of the surface electrode is measured by an external capacitive sensor electronics system. The capacitance of the surface electrode changes against ground when a body (for example, a human body or an object with a dielectric constant similar to that of a human body) comes into its proximity or, for example, contacts an insulator layer over the surface electrode. The insulator layer includes, in particular, the substrate itself. The change in capacitance is measured by the sensor electronics system; and when a threshold value is exceeded, a switching signal is triggered. The switching region is defined by the shape and size of the surface electrode.

In addition to the capacitance measurement against ground just presented, a differential capacitance measurement between the electrically conductive layer and another electrically conductive region can also be measured.

In an alternative of the composite pane according to the invention that is not part of the invention, the electrically conductive layer is electrically divided by at least one coating-free separation line into the capacitive switching region and a surrounding region. The surrounding region can be connected via another connection region to the sensor electronics system. In other words, the composite pane is contacted with four supply lines: one supply line for the capacitive switching region, one supply line for the surrounding region, and two supply lines for the busbars for the electrical heating through the heating wire.

In such an arrangement, the capacitive switching region and the surrounding region form two electrodes, which are capacitively coupled to one another. The capacitance of the capacitor formed by the electrodes changes with the approach of a body, for example, part of a human body. The change in capacitance is measured by the sensor electronics system, and when a threshold value is exceeded, a switching signal is triggered. The sensitive region is defined by the shape and size of the region in which the electrodes are capacitively coupled.

According to the invention, the heating circuit, i.e., the circuit made up of heating wire and busbars, is connected as a second electrode to the sensor electronics system. In other words, the heating wire and the busbars function as a surrounding region. This is particularly advantageous since the electrical connection of this second electrode to the sensor electronics system can even be done outside the composite pane, for example in the region of one of the supply lines, with which the busbars are connected to the operating voltage for the heating function, in particular with the ground line. Thus, a separate supply line to the surrounding region is eliminated, and the entire composite pane is only contacted with three supply lines: one supply line for the capacitive switching region and two supply lines for the busbars, wherein one of the supply lines lines for the busbars serves as an electrical line connection to the second input of the sensor electronics system.

The capacitive switching region and, optionally, the surrounding region or the heating circuit are integrated into the composite pane according to the invention. Thus, no switch or the like is necessary as a separate component that must be mounted on the composite pane. The composite pane preferably also has no other components that are arranged on its surfaces in the through-vision region. This is particularly advantageous in terms of a thin design of the composite pane as well as only slight interference with visibility through the composite pane.

The pane arrangement according to the invention includes a composite pane according to the invention and a sensor electronics system that is electrically connected via the connection region to the capacitive switching region and, optionally, via another connection region, to the surrounding area or the heating circuit. The sensor electronics system is a capacitive sensor electronics system.

In an advantageous embodiment of the switching arrangement according to the invention, the sensitivity of the sensor electronics system is selected such that upon contact of the contact region with a human finger on the substrate, the sensor electronics system outputs a switching signal, and upon contact of the contact region on the cover pane, outputs no switching signal or a different switching signal. Of course, the contacting of the contact region can also be done with multiple fingers or a different part of the human body. In the context of this invention, "contacting" means any interaction with the switching region that results in a measurable change of the measurement signal, i.e., in this case, the capacitance. In particular, this is contacting of an outer surface of the composite pane in a zone obtained by orthogonal projection of the contact region onto the outer surface.

In an advantageous embodiment of the invention, the surface capacitance $c_I$ between the contact region and the outer surface (IV) of the substrate is greater than the surface capacitance $c_A$ between the contact region and the outer surface (I) of the cover pane.

The surface capacitance $c_I$ or $c_A$ is defined as the capacitance of a plate capacitor of that region of the composite pane resulting from orthogonal projection of the contact region between the contact region and the outer surface of the substrate or the outer surface of the cover pane, with the resultant capacitance normalized over the area of the contact region. Here, the term "outer surface" means the surface of the composite pane that points outward, i.e., away from the composite pane. Accordingly, "inner surface" means the surface of the substrate or of the cover pane that points into the interior of the composite pane and is areally connected to an intermediate layer.

The surface capacitance is thus the capacitance of the entire layer sequence (coating). normalized over the area, from the electrically conductive layer all the way to the respective outer surface of the composite pane.

In an advantageous embodiment of the composite pane according to the invention, the ratio of the surface capacitance $c_I$ to the surface capacitance $c_A$ is greater than or equal to 1.1:1, preferably greater than or equal to 1.2:1. For such ratios, contacting of the outer surface of the substrate can already be distinguished well from contacting the outer surface of the cover pane.

The switching signals output can be of any type and adapted to the requirements of the respective use. Thus, the switching signal can mean a positive voltage, for example, 12 V; no switching signal can mean, for example, 0 V; and another switching signal can mean, for example, +6 V. The switching signals can also correspond to the voltages CAN_High and CAN_Low customary with a CAN-Bus and change by a voltage value between them. The switching signal can also be pulsed and/or digitally coded.

The sensitivity of the sensor electronics system can be determined as a function of the size of the contact region and as a function of the thickness of the substrate, intermediate layers, and cover pane in the context of simple experiments.

The particular advantage of such a pane arrangement according to the invention resides in that the switching signal can be triggered only upon contact of the composite pane from one of the outer surfaces. In the case of a use of the pane arrangement in a motor vehicle window and installation of the composite pane with the substrate side in the direction of the vehicle interior, it is possible, for example, to reliably avoid triggering the switching operation by individuals from the outside or an unintended triggering of the switching operation by rain or the movement of the windshield wiper, without fundamentally altering the pane construction generally customary for laminated safety glass. This was unexpected and surprising for the person skilled in the art.

In combination with the pane arrangement just described or alternatively thereto, the sensitivity of the sensor electronics system can be selected such that a switching signal is output when the contact region on the substrate and/or the cover pane is contacted by a human finger, and no switching signal or a different switching signal is output when the supply line region on the substrate and/or the cover pane is contacted.

The sensitivity of the sensor electronics system can be determined as a function of the size of the contact region and as a function of the geometry as well as the aspect ratio between width and length of the supply line region in the context of simple experiments. Here, it is particularly advantageous for the width of the supply line region to be selected as small as possible.

The particular advantage of this embodiment of a pane arrangement according to the invention resides in the fact that the switching signal can be triggered only by contacting the outer surface of the composite pane via the contact region or its immediate surroundings and, thus, precise control of the switching operation is possible, and, for example, inadvertent switching is prevented.

In an advantageous improvement of a pane arrangement according to the invention, the connection region is connected to a flat conductor, and the flat conductor is routed out of the pane. The integrated pane arrangement can then be particularly simply connected, at the place of use, to a voltage source and to a signal line, which evaluates the switching signal of the sensor circuit, for example, in a vehicle via a CAN-Bus.

In principle, all electrically insulating substrates that are thermally and chemically stable as well as dimensionally stable under the conditions of production and use of the composite pane according to the invention are suitable as a substrate and cover pane.

The substrate and/or the cover pane preferably contain glass, particularly preferably flat glass, float glass, quartz glass, borosilicate glass, soda lime glass, or clear plastics, preferably rigid clear plastics, in particular polyethylene, polypropylene, polycarbonate, polymethylmethacrylate, polystyrene, polyamide, polyesters, polyvinyl chloride, and/or mixtures thereof. The substrate and/or the cover pane are preferably transparent, in particular for the use of the pane as a windshield or rear window of a vehicle or other uses where high light transmittance is desired. In the context of the invention, "transparent" means a pane that has transmittance greater than 70% in the visible spectral range. However, for panes that are not situated in the traffic-relevant field of view of the driver, for example, for roof panels, the transmittance can also be much lower, for example, greater than 5%.

The thickness of the substrate and/or cover pane can vary widely and thus be ideally adapted to the requirements of the individual case. Preferably, standard thicknesses from 1.0 mm to 25 mm, preferably from 1.4 mm to 2.5 mm are used for vehicle glass and, preferably, from 4 mm to 25 mm for furniture, appliances, and buildings, in particular for electric heaters. The size of the pane can vary widely and is governed by the size of the use according to the invention. The substrate and, optionally, the cover pane have, for example, in automotive engineering and the architectural sector customary areas from 200 cm$^2$ up to 20 m$^2$.

The composite pane can have any three-dimensional shape. Preferably, the three-dimensional shape has no shadow zones such that it can, for example, be coated by cathodic sputtering. Preferably, the substrates are planar or slightly or greatly curved in one or a plurality of spatial directions. In particular, planar substrates are used. The substrate and the cover pane can be colorless or colored.

The substrate and/or the cover pane preferably have relative permittivity $\varepsilon_{r,1/4}$ from 2 to 8 and particularly preferably from 6 to 8. With such relative permittivities, it was possible to obtain a particularly good differentiation between contacting the contact surface via the outer surface of the substrate compared to the outer surface of the cover pane.

Substrates and/or cover panes are bonded to one another by at least one first and one second intermediate layer. The intermediate layer is preferably transparent. The intermediate layer preferably contains at least one plastic, preferably polyvinyl butyral (PUB), ethylene vinyl acetate (EVA), and/or polyethylene terephthalate (PET), The intermediate layer can, however, also contain, for example, polyurethane (PU), polypropylene (PP), polyacrylate, polyethylene (PE), polycarbonate (PC), polymethylmethacrylate, polyvinyl chloride, poly acetate resin, casting resins, acrylates, fluorinated ethylene propylenes, polyvinyl fluoride, and/or ethylene tetrafluoroethylene, or copolymers or mixtures thereof. The intermediate layer can be formed from one or a plurality of films arranged one over another, with the thickness of a film preferably being from 0.025 mm to 1 mm, typically 0.38 mm or 0.76 mm. In other words, the first or the second intermediate layer can be constructed in each case from one or a plurality of films. The intermediate layer can preferably be thermoplastic, and, after the lamination, adhesively bond the substrate, the cover pane, and any other intermediate layers to one another. In a particularly advantageous embodiment of the composite pane according to the invention, the first intermediate layer is implemented as an adhesive layer made of an adhesive, with which the carrier film is adhesively bonded on the substrate. In this case, the first intermediate layer preferably has the dimensions of the carrier film.

The intermediate layer preferably has relative permittivity from 2 to 4 and particularly preferably from 2.1 to 2.9. With such relative permittivities, it was possible to obtain a particularly good differentiation between contacting the contact surface via the outer surface of the substrate compared to the outer surface of the cover pane.

The carrier film according to the invention is preferably transparent. It preferably contains or is made of a polyethylene terephthalate (PET) film. The thickness of the carrier film is preferably from 0.025 mm to 0.1 mm. The carrier film preferably has a relative permittivity from 2 to 4 and particularly preferably from 2.7 to 3.3. With such carrier films, particularly good composite panes can be produced, since such thin carrier films, even with only section-wise arrangement, can be integrated well and optically inconspicuously into the composite pane. At the same time, good and selective switching signals can be produced. The electrically conductive layer according to the invention is preferably arranged on a surface of the carrier film, in other words, on precisely one of the two sides of the carrier film (i.e., on its front side or its back side).

The terms "substrate" and "cover pane" are selected to differentiate the two panes of a composite pane according to the invention. No statement about the geometric arrangement is associated with the terms. When the composite pane according to the invention is provided, for example, in an opening, for example, of a vehicle or a building, to separate the interior from the external environment, the substrate can be turned toward the interior or the external environment.

The electrically conductive layer preferably contains a transparent, electrically conductive coating. Here, "transparent" means permeable to electromagnetic radiation, preferably electromagnetic radiation of a wavelength of 300 nm to 1300 nm and in particular to visible light.

Electrically conductive layers according to the invention are known, for example, from DE 20 2008 017 611 U1, EP 0 847 965 B1, or WO2012/052315 A1. They typically contain one or a plurality, for example, two, three, or four electrically conductive, functional layers. The functional layers preferably contain at least one metal, for example, silver, gold, copper, nickel, and/or chromium, or a metal alloy. The functional layers particularly preferably contain at least 90 wt.-% of the metal, in particular at least 99.9 wt.-% of the metal. The functional layers can be made of the metal or of the metal alloy. The functional layers particularly preferably contain silver or a silver-containing alloy. Such functional layers have particularly advantageous electrical conductivity with, at the same time, high transmittance in the visible spectral range. The thickness of a functional layer is preferably from 5 nm to 50 nm, particularly preferably from 8 nm to 25 nm. In this range for the thickness of the functional layer, advantageously high transmittance in the visible spectral range and particularly advantageous electrical conductivity are obtained.

Typically, at least one dielectric layer is arranged, in each case, between two adjacent functional layers. Preferably, a further dielectric layer is arranged below the first and/or above the last functional layer. A dielectric layer includes at least one individual layer made of a dielectric material, for example, containing a nitride such as silicon nitride or an oxide such as aluminum oxide. However, the dielectric layer can also include a plurality of individual layers, for example, individual layers of a dielectric material, smoothing layers, adaptation layers, blocker layers, and or anti-reflexion layers. The thickness of a dielectric layer is, for example, from 10 nm to 200 nm.

This layer structure is, in general, obtained by a sequence of deposition operations that are performed by a vacuum method such as magnetically enhanced cathodic sputtering.

Other suitable electrically conductive layers preferably contain indium tin oxide (ITO), fluorine-doped tin oxide ($SnO_2$:F), or aluminum-doped zinc oxide (ZnO:Al).

The electrically conductive layer can, in principle, be any coating that can be electrically contacted. If the pane according to the invention is intended to enable vision through it, as is, for example, the case in panes in the window sector, the electrically conductive layer is preferably transparent. In an advantageous embodiment, the electrically conductive layer is a layer or a layer structure of multiple individual layers with a total thickness less than or equal to 2 μm, particularly preferably less than or equal to 1 μm.

An advantageous transparent electrically conductive layer according to the invention has sheet resistance of 0.4 ohm/square to 200 ohm/square. In a particularly preferred embodiment, the electrically conductive layer according to the invention has sheet resistance of 0.5 ohm/square to 20 ohm/square. Coatings with such sheet resistances are particularly suited for heating motor vehicle panes with typical onboard voltages from 12 V to 48 V or with electric vehicles with typical onboard voltages of up to 500 V.

The electrically conductive layer can extend over the entire surface of one side of the carrier film. However, alternatively, the electrically conductive layer can also extend over only a part of the surface of the carrier film. The electrically conductive layer can have one or a plurality of uncoated zones. These zones can be permeable to electromagnetic radiation and are, for example, known as data transmission windows or communication windows.

In an advantageous embodiment of a composite pane according to the invention, the electrically conductive layer is arranged set back from the edge of the composite pane by a width of 2 mm to 50 mm, preferably of 5 mm to 20 mm. The electrically conductive layer then has no contact with the atmosphere and is, in the interior of the composite pane, advantageously protected by the intermediate layers against damage and corrosion.

The electrical supply line is preferably implemented as a foil conductor or a flexible foil conductor (flat conductor, flat band conductor). The term "foil conductor" means an electrical conductor whose width is significantly greater than its thickness. Such a foil conductor is, for example, a strip or band containing or made of copper, tinned copper, aluminum, silver, gold, or alloys thereof. The foil conductor has, for example, a width of 2 mm to 16 mm and a thickness of 0.03 mm to 0.1 mm. The foil conductor can have an insulating, preferably polymeric sheathing, for example, based on polyimide. Foil conductors that are suitable for the contacting of electrically conductive coatings in panes have a total thickness of, for example, merely 0.3 mm. Such thin foil conductors can be embedded without difficulty between the individual panes in the thermoplastic intermediate layer. Multiple conductive layers electrically isolated from one another can be situated in a foil conductor strip.

Alternatively, thin metal wires can also be used as an electrical supply line. The metal wires contain, in particular, copper, tungsten, gold, silver, or aluminum or alloys of at least two of these metals. The alloys can also contain molybdenum, rhenium, osmium, iridium, palladium, or platinum.

The electrical line connection between the connection regions of the electrically conductive layer on the carrier film and the electrical supply line is preferably done via electrically conductive adhesives, which enable a reliable and durable electrical line connection between the connection region and the supply line. Alternatively, the electrical line connection can also be done by clamping since the clamp connection is securely fixed against sliding by the lamination procedure. Alternatively, the supply line can also be printed onto the connection region, for example, by means of a metal-containing and, in particular, silver-containing, electrically conductive printing paste.

In an advantageous embodiment of the invention, the composite pane according to the invention has a light irradiation means and a light deflection means. The light irradiation means and the light deflection means are arranged in or on the substrate and/or on the cover pane or between the intermediate layers or the carrier film.

According to the invention, the light irradiation means comprises at least one light source, preferably an LED or OLED. The particular advantage resides in the small dimensions and the low power consumption. The wavelength range emitted by the light source can be selected freely in the range of visible light, for example, based on practical and/or aesthetic considerations. The light irradiation means can include optical elements, in particular for guiding the light, preferably a reflector and/or a light waveguide, for example, a glass fiber or a polymeric optical fiber. The light irradiation means can be arranged at any location on the substrate or the cover pane, in particular on the lateral edge of the substrate or of the cover pane or in a small recess in the middle of the substrate or cover pane.

The light deflection means preferably includes particles, dot grids, stickers, deposits, notches, incisions, line grids, imprints, and/or screen prints and is suitable to decouple the light transported in the substrate or in the cover pane therefrom.

The light deflection means can be arranged at any position on the level of the substrate or the cover pane. It is particularly advantageous for the light deflection means to be arranged in the region of or in the immediate surroundings of the contact region and thus to enable rapid finding of the otherwise hardly visible contact region. This is particularly advantageous at night or in darkness.

Alternatively, light can be introduced to the contact region through a waveguide that is arranged on the substrate, the intermediate layer, or the cover pane and can mark the contact region.

Alternatively or in combination, the light irradiation means together with the light deflection means can visualize data on the pane, for example, report the switching state of the capacitive switching region or indicate whether, for example, an electrical function is switched on or switched off.

In an alternative advantageous embodiment of the composite pane according to the invention, the contact region is directly markable or marked by an active light source, preferably by a light emitting diode (LED), an organic light emitting diode (OLED), an incandescent light bulb, or other active luminary, such as a luminescent material, preferably a florescent or phosphorescent material.

In another alternative advantageous embodiment of the composite pane according to the invention, the contact region is marked by a colored, preferably a white or black, imprint, for example, a screenprint, on the transparent substrate, the intermediate layer, or the cover pane. This has the particular advantage that the contact region is marked durably and independently of a voltage source. The imprint can also contain a luminescent material, preferably a florescent or phosphorescent material and/or be luminescent.

In a preferred embodiment, the busbars are implemented as strips of an electrically conductive foil. The conductive foil preferably contains aluminum, copper, tinned copper, gold, silver, zinc, tungsten, and/or tin or alloys thereof, particularly preferably copper.

The thickness of the busbars is preferably from 10 µm to 500 µm, particularly preferably from 30 µm to 200 µm, for example, 50 µm or 100 µm. Busbars made of electrically conductive foils with these thicknesses are technically simple to realize and have an advantageous current carrying capacity.

The length of the busbars depends on the design of the composite pane, in particular, on the length of the edge along which the busbars are arranged and the number of heating wires to be contacted, and can be appropriately selected in the individual case by the person skilled in the art. The "length" of the typically strip-shaped busbars means their longer dimension, along which they are customarily contacted with the different heating wires or heating wire sections.

The width of the busbars is preferably from 2 mm to 20 mm, particularly preferably from 5 mm to 10 mm. With this, good results are obtained in terms of heating power, but also in terms of visual inconspicuousness.

The busbars can be electrically conductingly connected to the heating wires directly or, for example, via a soldering compound or an electrically conductive adhesive.

In a preferred embodiment of the invention, the connection of the connecting cable to the external power supply is done in the region of one of the side edges, in the example of a side pane of a vehicle, preferably in the region of the lower edge. Thus, the connecting cable can be concealed in the vehicle body. The side pane preferably has, for this, at least one supply line, which is electrically contacted with a busbar and runs, starting from the busbar, to the lower edge. Preferably, each busbar is provided with such a supply line. The supply lines can, for example, run in the form of a straight stretch to the lower edge, to be contacted there (for example, in the region of the projection of the busbars onto the lower edge). The supply lines can terminate already within the laminate, i.e., before reaching the lower edge and be contacted by a flat conductor. Alternatively. the supply lines can extend beyond the lower edge for contacting with the external connecting cables outside the laminate.

The supply line in the composite pane is preferably implemented as strips of an electrically conductive foil. The conductive foil preferably contains aluminum, copper, tinned copper, gold, silver, zinc, tungsten, and/or tin or alloys thereof, particularly preferably copper. The thickness of the foil is preferably from 10 µm to 500 µm, particularly preferably from 30 µm to 200 µm, for example, 50 µm or 100 µm. The width of the supply lines is preferably from 2 mm to 20 mm, particularly preferably from 5 mm to 10 mm. Advantageously, the supply lines are made of the same foil as the busbars.

In a preferred embodiment, the heating wire contains aluminum, copper, tinned copper, gold, silver, zinc, tungsten, and/or tin or alloys thereof, particularly preferably copper and/or tungsten. This is advantageous for the heating power.

The thickness of the heating wire is preferably from 10 µm to 200 µm, particularly preferably from 20 µm to 100

μm, for example, 30 μm or 70 μm. Thus, good heating effects are obtained. In addition, such wires are adequately thin to be visually inconspicuous.

In a preferred embodiment of the invention, the heating power of the composite pane is at least 250 W/m². With this, an advantageous heating effect is obtained.

A further aspect of the invention comprises a method for producing a pane arrangement having a heatable composite pane having a capacitive switching region, at least comprising:
(a) Cutting a first intermediate layer (3) to size and applying a transparent, electrically conductive layer (6) on the surface of one side of a carrier film (5) by cathodic sputtering,
(b) Applying two busbars (22) on the surface of the first intermediate layer (3) and applying at least one heating wire (21) on the surface of the first intermediate layer (3), wherein the heating wire (21) is electrically conductingly connected to both busbars (22),
(c) Producing a stack sequence of a substrate (1), the first intermediate layer (3) with the heating wire (21) and with the busbars (22), a carrier film (5) with an electrically conductive layer (6), and a cover pane (4), and
(d) Laminating the stack sequence to form a composite pane (100).

The application of the electrically conductive layer in process step (a) can be done by methods known per se, preferably by magnetically enhanced cathodic sputtering. This is particularly advantageous in terms of simple, quick, economical, and uniform coating of the substrate. However, the electrically conductive layer can also be applied, for example, by vapor deposition, chemical vapor deposition (CVD), plasma-enhanced chemical vapor deposition (PECVD), or by wet chemical processes.

The carrier film can be subjected to a temperature treatment after process step (a). The carrier film with the electrically conductive layer is heated to a temperature of at least 200° C., preferably at least 300° C. The temperature treatment can serve to increase transmittance and/or to reduce the sheet resistance of the electrically conductive layer.

In an advantageous embodiment of the method according to the invention, at least one separation line, which electrically divides the electrically conductive layer into at least one capacitive switching region and at least one surrounding region, is introduced into the electrically conductive layer preferably by laser patterning or by mechanical or chemical ablation.

The de-coating of individual separation lines in the electrically conductive layer is preferably done by a laser beam. Methods for patterning thin metal films are known, for example, from EP 2 200 097 A1 or EP 2 139 049 A1. The width of the de-coating is preferably 10 μm to 1000 μm, particularly preferably 30 μm to 200 μm, and in particular 70 μm to 140 μm. In this range, a particularly clean and residue-free de-coating by the laser beam takes place. De-coating by laser beam is particularly advantageous since the de-coated lines are optically very inconspicuous and impact the appearance and the transparency only a little. The de-coating of a line with a width that is wider than the width of a laser cut is done by repeated wearing down of the line with the laser beam. Consequently, the process duration and the process costs increase with an increasing line width. Alternatively, the de-coating can be done by mechanical ablation as well as by chemical or physical etching.

The first or the second intermediate layer can be formed by a single film or even by two or more films that are arranged areally one over another.

The bonding of the substrate and cover pane in process step (d) is preferably done under the action of heat, vacuum, and/or pressure. Methods known per se for producing a composite pane can be used.

For example, so-called autoclave methods can be performed at an elevated pressure of approx. 10 bar to 15 bar and temperatures from 130° C. to 145° C. over approx. 2 hours. Vacuum bag or vacuum ring methods known per se operate, for example, at approx. 200 mbar and 80° C. to 110° C. The first pane, the thermoplastic intermediate layer, and the second pane can also be pressed in a calender between at least one pair of rollers to form a pane. Systems of this type for producing panes are known and normally have at least one heating tunnel upstream before a pressing facility. The temperature during the pressing operation is, for example, from 40° C. to 150° C. Combinations of calender and autoclave processes have particularly proved their worth in practice. Alternatively, vacuum laminators can be used. These consist of one or a plurality of heatable and evacuable chambers, in which the first pane and the second pane are laminated within, for example, approx. 60 minutes at reduced pressures of 0.01 mbar to 800 mbar and temperatures from 80° C. to 170° C.

The busbars and the heating wires are preferably heated, at least in regions, during or before application on the first intermediate layer.

The mounting of the busbars can, in particular, be done by placement, but also by adhesive bonding. The heating of the busbars is done, for example, with a soldering iron. By means of the heating, the thermoplastic intermediate layer is to be slightly melted and thus bonded to the busbar. The temperature is preferably from 150° C. to 240° C.

Instead of using a soldering iron, it is also possible to apply the busbars on the intermediate layer with a plotter and a heated wheel or to embed them in the surface thereof.

If the heating wire is to be arranged sandwich-like between two busbars, the upper busbar (i.e., the one that is farther from the intermediate layer at the time of placement on the intermediate layer) is preferably fixed with a higher temperature, for example, from 300° C. to 360° C.).

The application of the heating wire is preferably done with a so-called "plotter". Here, the heating wire is moved with a robot arm and reeled off a spool. The heating wire is preferably heated during application such that the thermoplastic intermediate layer melts and bonds to the heating wire. In particular, the heating wire should penetrate completely or partially into the surface of the intermediate layer such that it is embedded in the surface of the intermediate layer.

Another aspect of the invention comprises the use of the pane arrangement having an electrically heatable pane having a capacitive switching region according to the invention in buildings, in particular in the access area, window area, roof area, or façade area, as a built-in component in furniture and devices, in means of transportation for travel on land, in the air, or on water, in particular in trains, watercraft, and motor vehicles, for example, as a windshield, rear window, side window, and or roof panel.

Also shown is the use of the capacitive switching region for the electrical control of a function inside or outside the composite pane, preferably a heating function, lighting, in particular a lighting means arranged in the composite pane such as an LED, a change in the optical transparency of a functional intermediate layer, in particular a suspended particle device (SPD) layer or an electrochromic intermediate layer.

In the following, the invention is explained in detail with reference to drawings and exemplary embodiments. The drawings are a schematic representation and not true to scale. The drawings in no way restrict the invention.

Figure 1B:
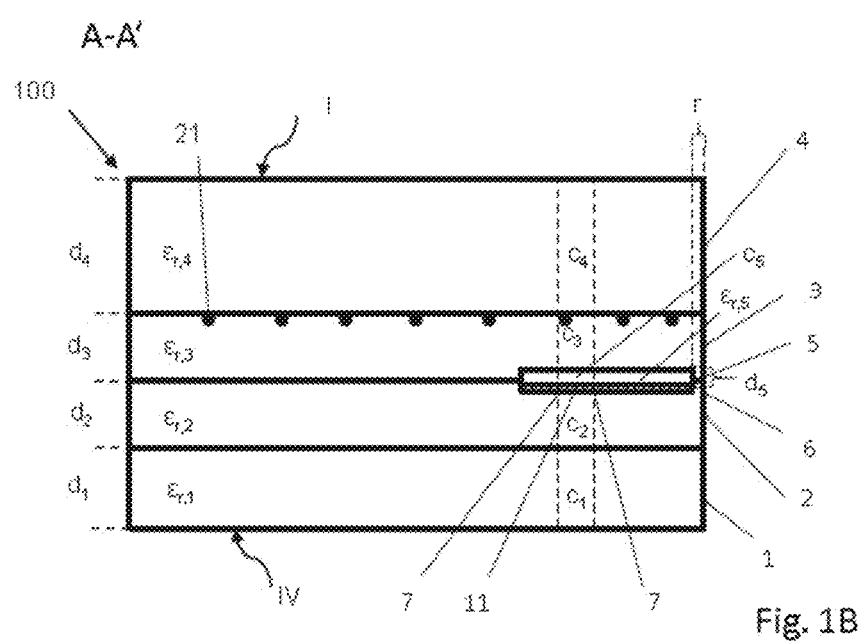
Figure 1C:
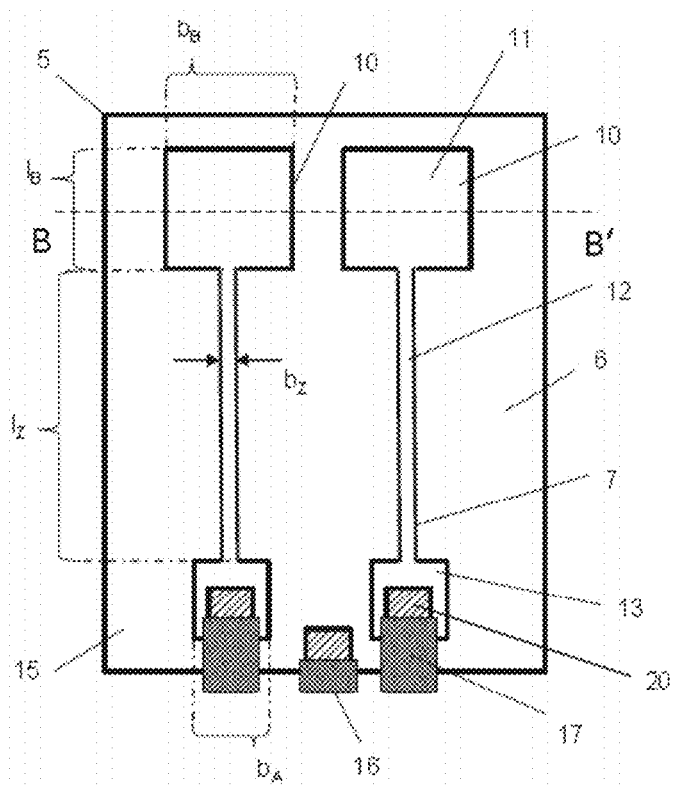
Figure 1D:
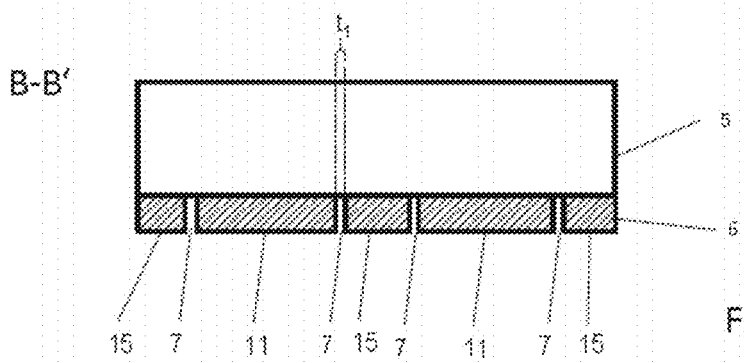
Figure 2A:
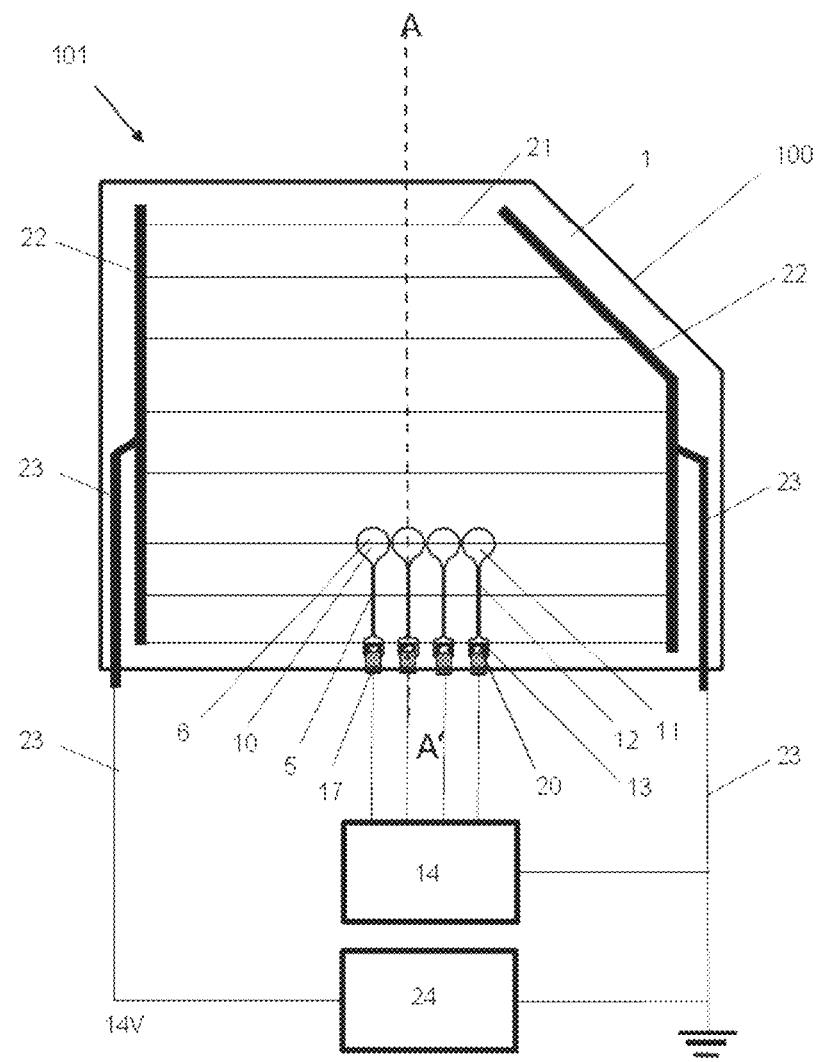
Figure 2B:
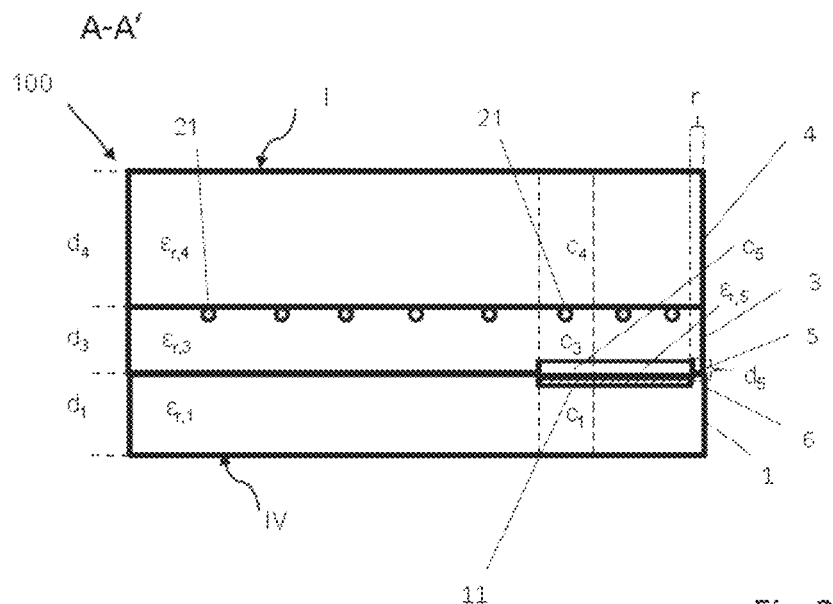
Figure 2C:
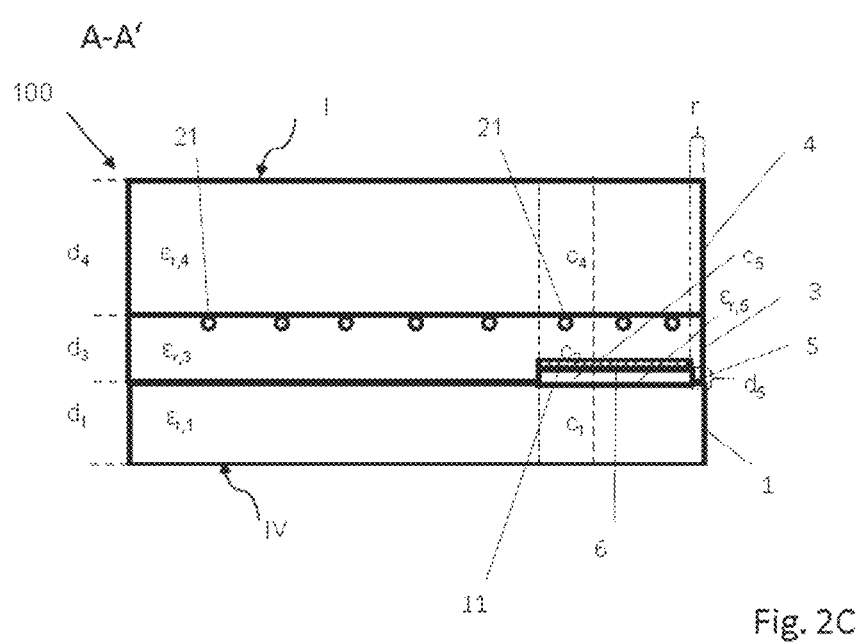
Figure 2D:
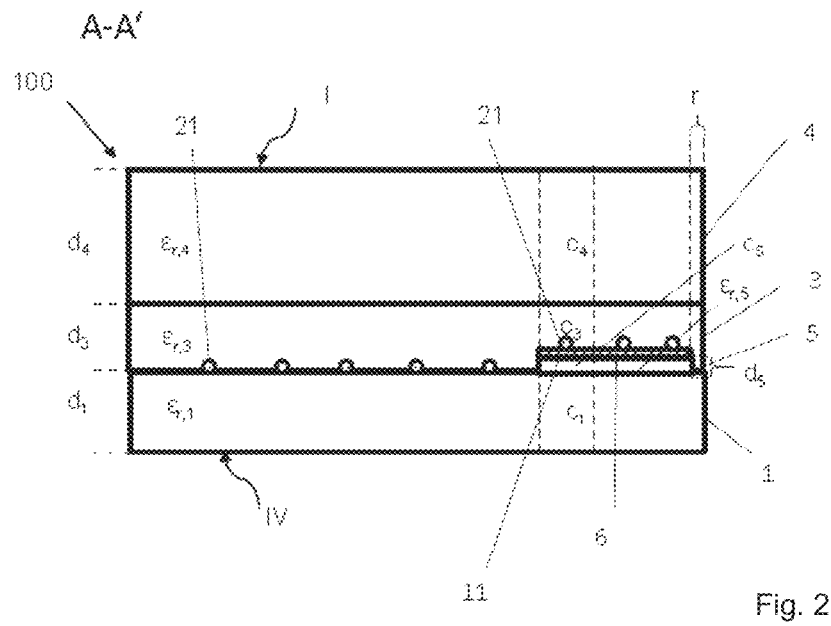
Figure 3:
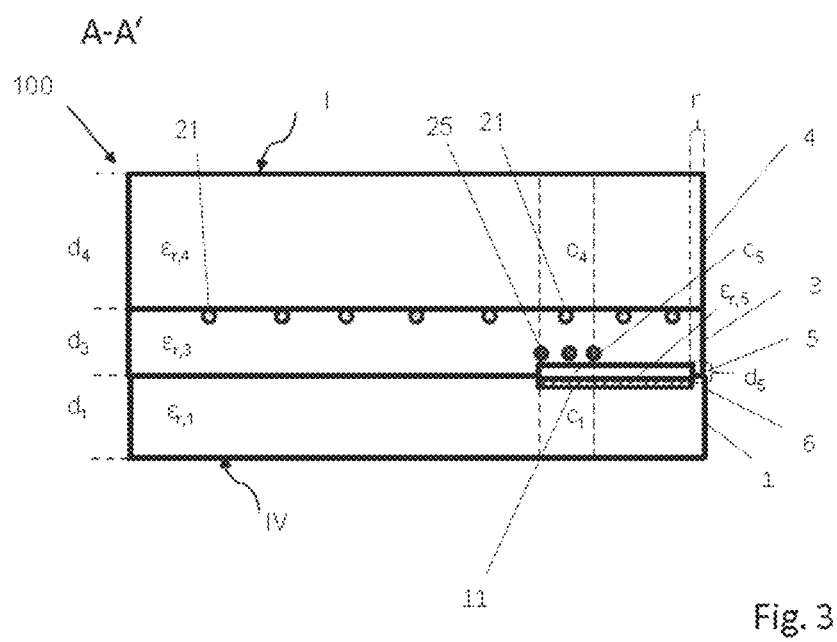
Figure 4:
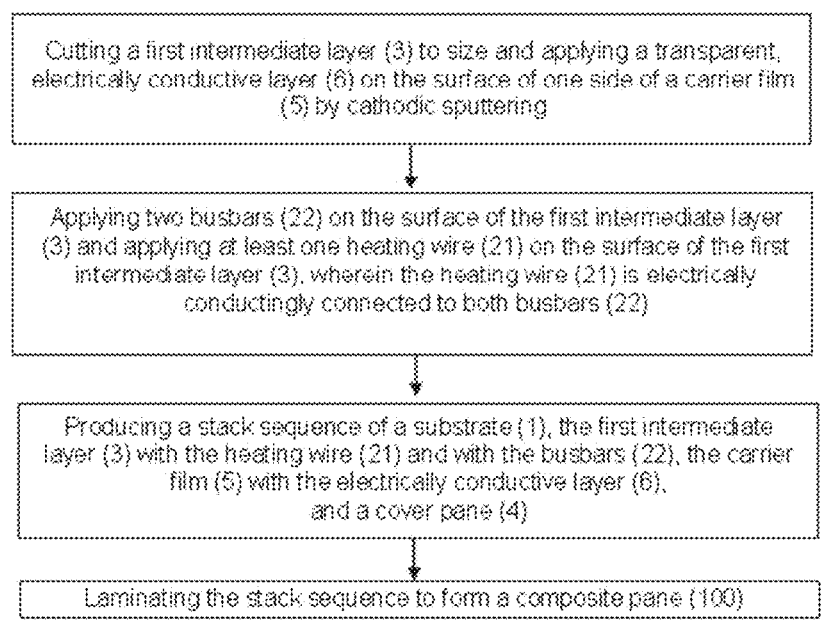

They depict:

FIG. 1A a plan view of an embodiment of a pane arrangement according to the invention with a composite pane according to the invention, FIG. 1B a cross-sectional representation along the section line A-A' of FIG. 1A, FIG. 1C an enlarged representation of the carrier film according to the invention of FIG. 1A, FIG. 1D a cross-sectional representation along the section line B-B' of FIG. 10, FIG. 2A a plan view of an alternative embodiment of a pane arrangement according to the invention with a composite pane according to the invention, FIG. 2B a cross-sectional representation along the section line A-A' of FIG. 2A, FIG. 2C a cross-sectional representation of an alternative embodiment of a composite pane according to the invention along the section line A-A' of FIG. 2A, and FIG. 2D a cross-sectional representation of an alternative embodiment of a composite pane according to the invention along the section line A-A' of FIG. 2A, and FIG. 3 a cross-sectional representation of an improvement of a composite pane according to the invention along the section line A-A' of FIG. 2A, and FIG. 4 a detailed flowchart of one embodiment of the method according to the invention.

FIG. 1A depicts a plan view of an exemplary embodiment of a pane arrangement 101 according to the invention with a composite pane 100 according to the invention.

FIG. 1B is a cross-sectional representation along the section line A-A' of FIG. 1A. The composite pane 100 comprises here, for example, a substrate 1 and a cover pane 4, which are bonded to one another via a first intermediate layer 3 and a second intermediate layer 2. The composite pane 100 is, for example, a motor vehicle pane and, in particular, the windshield of a passenger car. The dimensions of the composite pane 100 are, for example, 0.9 m x 1.5 m. The substrate 1 is, for example, intended to be turned toward the interior in the installed position. In other words, the outer surface IV of the substrate 1 is accessible from the interior; whereas, in contrast, the outer surface I of the cover pane 4 points outward relative to the vehicle interior. The substrate 1 and cover pane 4 are made, for example, of soda lime glass. The thickness d1 of the substrate 1 is, for example, 1.6 mm and the thickness d4 of the cover pane 4 is 2.1 mm. Of course, the substrate 1 and cover pane 4 can have any thicknesses, and, for example, can also be implemented with the same thickness. The intermediate layers 2,3 are thermoplastic intermediate layers and are made of polyvinyl butyral (PVB). They have, in each case, a thickness d2/3 of, for example, 0.38 mm. A carrier film 5 with, for example, four capacitive switching regions 10 is arranged between the first intermediate layer 3 and the second intermediate layer 2 in the central, lower section of the composite pane 100.

In the example depicted, eight heating wires 21, which run parallel to the bases of the trapezoidal composite pane 100, are, for example, arranged between the first intermediate layer 3 and the cover pane 4. The heating wires 21 are, in each case, connected at their ends to a busbar 22, the busbars 22 being in each case connected to a supply line 23. The heating wires 21 are thus connected to the busbars 22 in a parallel circuit such that upon application of an electrical voltage to the busbars 22 (via the supply lines 23), a heating current can flow through the heating wires 21. The heating current results in heating of the heating wires 21 due to development of Joule heat such that the composite pane 100 as a whole can be electrically heated.

The heating wires 21 are made, for example, in each case of a 30-μm-thick copper wire, which has an electrically insulating sheathing, black- or green-colored, for example. This sheathing has multiple advantages: the copper wire can be arranged depending on the requirements of the embodiment, and, for example, also cross over other electrically conductive structures without a short-circuit occurring. Moreover, the heating wire is protected against corrosion by the polymeric sheathing. Additionally, the reflection on the colored sheathing is lower than on the metallic copper inner conductor, such that the heating wire is visually less conspicuous.

Each heating wire 21 is electrically contacted on its ends to, in each case, a busbar 22. The busbars 22 are implemented as strips of a copper foil, with a thickness of, for example, 100 μm and a width of, for example, 7 mm. When a voltage is applied to the busbars 22, a current flows through the heating wires 21, creating the heating action. The voltage can be the customary motor vehicle on-board voltage of 14 V, or also a voltage of, for example, 42 V or 48 V.

FIG. 10 depicts an enlarged representation of the carrier film 5 according to the invention of FIG. 1A, FIG. 1D depicts a corresponding cross-sectional representation along the section line B-B' of FIG. 10.

The carrier film 5 is, in this example, a transparent polyethylene terephthalate (PET) film with a thickness $d_5$ of 0.05 mm. A transparent electrically conductive layer 6 is arranged on the carrier film 5. The electrically conductive layer 6 is a layer system that includes, for example, three electrically conductive silver layers that are separated from one another by dielectric layers.

The electrically conductive layer 6 extends, for example, over one entire side of the carrier film 5. In the exemplary embodiment depicted, the electrically conductive layer 6 is arranged on that side of the carrier film 5 that faces the substrate 1. The carrier film 5 is set back by a distance of approx. 8 mm from the pane edge into the pane interior. This region is hermetically sealed by gluing the two intermediate layers 2,3 during lamination such that the electrically conductive layer 6 is protected against moisture from the surroundings of the composite pane 100 and, thus, against corrosion and damage. Alternatively, it would be possible to leave the carrier film 5 coating free in an edge region or to remove the electrically conductive layer 6 there.

The electrically conductive layer 6 is divided by coating-free separation lines 7 into different regions electrically isolated from one another. In the example depicted in FIG. 1C, two capacitive switching regions 10 are electrically divided by a common surrounding region 15. Each switching region 10 includes a contact region 11, which is implemented nearly square and transitions into a strip-shaped supply line region 12. The width $b_B$ and the length $l_B$ of the contact region 11 is, in each case, for example, 40 mm. The width $b_Z$ of the supply line region 12 is, for example, 1 mm. The ratio of $b_Z:b_B$ is thus approx. 1:40. The supply line region 12 is connected to a connection region 13. The connection region 13 has a square shape and an edge length $b_A$ of, for example, 12 mm, The length $l_Z$ of the supply line region is approx. 48 mm.

The separation line 7 has a width $t_1$ of, for example, only 100 μm and is introduced into the electrically conductive layer 6, for example, by laser patterning. Separation lines 7 with such a low width are hardly perceptible optically and interfere only a little with vision through the composite pane 100, which, particularly for use in motor vehicles, is of special importance for driving safety and is also particularly aesthetic.

The connection region 13 is electrically conductingly connected to a foil conductor 17 via an electrical line connection 20. A reliable electrically conducting connection is preferably obtained by means of an electrically conductive adhesive. The foil conductor 17 is made, for example, from a 50-μm-thick copper foil and is, for example, insulated outside the connection region 13 with a polyimide layer. Thus, the foil conductor 17 can be guided out, without an electrical short-circuit, beyond the surrounding region 15 via the bottom edge of the composite pane 100. Of course, the electrical line connection of the connection region to the outside can also be guided outward via insulated wires or via a region in which the electrically conductive layer of the surrounding region is interrupted.

Here, the foil conductor 17 is, for example, connected to a capacitive sensor electronics system 14 outside the composite pane 100. Moreover, the surrounding region 15 is also connected to the sensor electronics system 14 via another connection region 16. The sensor electronics system 14 is suited to precisely measure capacitance changes of the switching region 10 relative to the surrounding region 15 and to forward a switching signal, for example, to the CAN-Bus of a motor vehicle as a function of a threshold value. Any functions in the motor vehicle can be switched via the switching signal. For example, the electrical heating function of the composite pane 100 can be switched on or off by applying and switching off an electrical voltage to the heating circuit made up of busbars and heating wires.

When the composite pane 100 is used, for example, as a windshield in a motor vehicle, the length of the supply line region 12 can be selected such that the driver of the vehicle or the front seat passenger can comfortably reach the contact region 11 of the switching region 10.

In the exemplary embodiment depicted, the structure and tuning of the sensor electronics system 14 are coordinated such that when the outer pane surface IV of the substrate 1 is contacted via the contact region 11 of the capacitive switching region 10, a switching signal is triggered, whereas when the outer pane surface I of the cover pane 4 is contacted via the capacitive switching region 10, no switching signal is triggered. To this end, the thicknesses and the materials of the composite pane 100 according to the invention are selected according to the invention such that the surface capacitance $c_I$ between the contact region 11 and the outer surface IV of the substrate 1 is greater than the surface capacitance $c_A$ between the contact region 11 and the outer surface I of the cover pane 4.

The surface capacitance $c_I$ or $c_A$ is, in the context of the present invention, defined as the capacitance of a plate capacitor of that region of the composite pane 100, which results from orthogonal projection of the contact region 11 between the contact region 11 and the outer surface IV of the substrate 1 or the outer surface I of the cover pane 4, with the resultant capacitance normalized over the area of the contact region.

In the example depicted in detail in FIG. 1B, the surface capacitance c, between the contact region 11 and the outer surface IV of the substrate 2 results as the serial connection of the individual capacitances $(1/c_1+1/c_2)^{-1}$, with the individual capacitance resulting at $c_i=\varepsilon_0*\varepsilon_{r,i}/d_i$. This corresponds to the capacitance $C_i$ of the respective individual layer with relative permittivity $\varepsilon_{r,i}$ and thickness $d_i$, normalized over the area A of the contact region 11, i.e., $c_i=C_i/A$.

Moreover, the surface capacitance $c_I$, between the contact region 11 and the outer surface I of the cover pane 4 results as the serial connection of the individual capacitances $(1/c_3+1/c_4+1/c_5)^{-1}$.

The relative permittivity of the substrate 1 and of the cover pane 4 are, here, for example, $\varepsilon_{r,1}=\varepsilon_{r,4}=7$; the relative permittivity of the first intermediate layer 3 and the second intermediate layer 2 are, here, for example, $\varepsilon_{r,2}=\varepsilon_{r,3}=2.6$, and the relative permittivity of the carrier film 5 is, here, for example, $\varepsilon_{r,5}=3$. This yields a ratio of the surface capacitances $c_I:c_A$ at 1.2:1.

Moreover, in this example, the area A of the contact region 11 and in particular its width $b_B$ is coordinated with the width $b_Z$ of the supply line region 12 such that a switching signal is output only when the outer surface IV of the substrate is contacted via the contact region 11 (i.e., in the region of the surface IV that results from orthogonal projection of the contact region 11 onto the surface IV) and not when the surface IV is contacted via the supply line region 12.

As experiments of the inventors surprisingly showed, the presence of the heating wires between the contact region 11 of the electrically conductive layer 6 and the cover pane 4 further increases the selectivity, in other words, the sensitivity upon contact on the outer surface IV of the substrate 1 is further increased significantly compared to contacting the outer surface I of the cover pane 4. This was unexpected and surprising.

FIG. 2A depicts a plan view of an alternative exemplary embodiment of a pane arrangement 101 according to the invention with a composite pane 100 according to the invention.

FIG. 2B is a cross-sectional representation along the section line A-A' of FIG. 2A. For simplification, the foil conductor 17 is not shown. Here, the composite pane 100 comprises, for example, a substrate 1 and a cover pane 4, which are bonded to one another via a first intermediate layer 3. The composite pane 100 is, for example, a pane and in particular the side pane of a passenger car. The dimensions of the composite pane 100 are, for example, 1.0 m×0.6 m, wherein the front edge of the side pane is slanted in the region of the upper edge. The substrate 1 is, for example, intended to face the interior in the installed position. In other words, the outer surface IV of the substrate 1 is accessible from the interior, whereas, in contrast, the outer surface I of the cover pane 4 points outward. The substrate 1 and the cover pane 4 are made, for example, of soda lime glass. The thickness $d_1$ of the substrate 1 is, for example, 2.1 mm; and the thickness $d_4$ of the cover pane 4 is, for example, likewise 2.1 mm. The first intermediate layer 3 it is a thermoplastic intermediate layer and is made of polyvinyl butyral (PVB). It has a thickness $d_3$ of 0.76 m.

Eight heating wires 21 are, for example, embedded in the surface of the first intermediate layer 3 facing the cover pane 4. The heating wires 21 are made, for example, of copper and have a thickness of 30 μm. Each heating wire 21 is electrically contacted on its ends with a busbar 22 in each case. The busbars 22 are implemented as strips of a copper foil, with a thickness of, for example, 100 μm and a width of, for example, 7 mm. When a voltage is applied on the busbars 22, a current flows through the heating wires 21, creating the heating action. The voltage can be the customary motor vehicle on-board voltage of 14 V or also a voltage of, for example, 42 V or 48 V, In the exemplary embodiment depicted, the busbars 22 are connected to a voltage source 24, which provides a ground potential on one busbar 22 and a voltage of 14 V on the other busbar 22.

In the central, lower section of the composite pane 100, four carrier films 5, each with a capacitive switching region 10, are arranged between the first intermediate layer 3 and the substrate 1. The carrier films 5 have on one end a drop-shaped configuration, which forms the contact region 11. The contact region 11 is electrically conductingly connected via a narrow region of the carrier film 5, the supply line region 12, to a square connection region 13. In this example, each carrier film 5 has a complete electrically conductive layer 6, which is not divided by separation lines or other isolations. In other words, here, the carrier films 5 have no surrounding region.

The carrier film 5 is, in this example, a transparent polyethylene terephthalate (PET) film with a thickness $d_5$ of 0.05 mm. The electrically conductive layer 6 is a layer system that contains, for example, three electrically conductive silver layers that are separated from one another by dielectric layers.

Each switching region 10 includes a contact region 11, which is implemented approx. drop-shaped and transitions into a strip-shaped supply line region 12. The width $b_B$ and the length $l_B$ of the contact region 11 is, in each case, for example, 40 mm. The width $b_Z$ of the supply line region 12 is, for example, 1 mm. The ratio of $b_Z:b_B$ is thus approx. 1:40. The supply line region 12 is connected to a connection region 13. The connection region 13 has a square shape with rounded corners and an edge length $b_A$ of, for example, 12 mm. The length $l_Z$ of the supply line region is approx. 48 mm.

The electrically conductive layer 6 extends, for example, over the entire surface of one side of the carrier film 5. The carrier film 5 has a distance from the edge of, for example, 15 mm to the nearest side edge of the composite pane 100. This region is hermetically sealed by adhesive bonding of the first intermediate layer 3 to the substrate 1 during lamination such that the electrically conductive layer 6 is protected against moisture from the surroundings of the composite pane 100 and thus against corrosion and damage. In the exemplary embodiment depicted, the electrically conductive layer 6 is arranged on that side of the carrier film 5 that faces the substrate 1.

The connection region 13 is electrically conductingly connected to a foil conductor 17 via an electrical line connection 20. A reliable electrically conducting connection is achieved preferably by an electrically conductive adhesive. The foil conductor 17 is made, for example, of a 50-μm-thick copper foil and is, for example, isolated outside the connection region 13 with a polyimide layer. Thus, the foil conductor 17 can be routed out without electrical short-circuit beyond the surrounding region 15 via the lower edge of the composite pane 100. Of course, the electrical connection of the connection region 13 to the outside can also be guided outward via insulated wires or via a region in which the surrounding region 15 is interrupted.

Here, the foil conductor 17 is connected, for example, outside the composite pane 100 to a capacitive sensor electronics system 14.

As already mentioned, the carrier film 5 has, in this exemplary embodiment, no surrounding region; in other words, the electrically conductive layer 6 completely forms the contact region 11, the supply line region 12, and the connection region 13. In order to nevertheless enable a differential measurement of the capacitance, the sensor electronics system 14 is electrically conductingly connected to one of the supply lines 23 of the busbars 22. In this example, via the supply line of the busbar 22 that is connected to the vehicle ground (on the right, in FIG. 2A).

The sensor electronics system 14 is suitable for precisely measuring capacitance changes of the switching region 10 compared to the heating circuit composed of heating wires 21 and busbars 22 and for forwarding a switching signal, for example, as a function of a threshold value, to the CAN-Bus of a vehicle. For this, it is particularly advantageous for the capacitive switching area 10 in projection through the composite pane 100, to overlap one of the heating wires 21.

Any functions in the vehicle can be switched via the switching signal. For example, the power supply 24 of the heating circuit composed of heating wires 21 and busbars 22 can be selectively turned on or off or regulated, and the heating function of the composite pane 100 can thus be controlled.

Alternatively or additionally, the composite pane 100 can have a suspended particle device (SPD). an electrochromic or other type of layer or film for controlling optical transparency, which can be changed in its optical transparency by the switching signal, here, for example, with four transparency levels, which can be selected in each case via the four capacitive switching regions 10. Of course, alternatively or additionally, other electrical functions, such as electrical lighting, moving of the composite pane 100, for example, opening or closing of a side window in a vehicle door, can be controlled. Alternatively or additionally, one or a plurality of capacitive switching areas 10 can form a keypad and coupled to an electronics system, can, for example, upon input of a specific key sequence, open or lock a vehicle door, switch an alarm system on, or perform complex controls.

If the composite pane 100 is used, for example, as a roof panel in a vehicle, the length of the supply line region 12 can be selected such that the driver of the vehicle, the front seat passenger, or a passenger in the backseat can conveniently reach the contact region 11 of the switching region 10. Of course, for this, even multiple carrier films 5 can be arranged in the composite pane 100, for example, a carrier film 5 for each vehicle occupant.

In the exemplary embodiment depicted, the structure and tuning of the sensor electronics system 14 are coordinated such that when the outer pane surface IV of the substrate 1 is contacted via the contact region 11 of the capacitive switching region 10, a switching signal is triggered, whereas when the outer pane surface I of the cover pane 4 is contacted via the capacitive switching region 10, no switching signal is triggered. This has the particular advantage that no switching signal can be triggered by intentional or unintended contacting of the composite pane 100 from outside the vehicle. Also, unintended triggering of a switching signal, for example, by rain or by a carwash is avoided. For this, the thicknesses in the materials of the composite pane 100 according to the invention are selected such that the surface capacitance $c_I$ between the contact region 11 and the outer surface IV of the substrate 1 is greater than the surface capacitance $c_A$ between the contact region 11 and the outer surface I of the cover pane 4. Furthermore, it is advantageous but not essential for the capacitive switching area 10 to be arranged nearer the substrate 1 than the heating circuit.

The cross-sectional view depicted in FIG. 2C corresponds to a composite pane 100 according to that of FIG. 2B, wherein only the electrically conductive layer 6 is arranged on that side of the carrier film 5 that faces away from the substrate 1.

The cross-sectional view depicted in FIG. 2D corresponds in its configuration to that of FIG. 2C, wherein the heating wires 21 and the busbars 22 are arranged not between the cover pane 4 and the first intermediate layer 3 but rather between the substrate 1 and the first intermediate layer 3, Here, the heating wires are arranged immediately adjacent the electrically conductive layer 6. In order to avoid electrical short circuits, the heating wires 21 are electrically isolated by a polymeric sheathing. As investigations of the inventor surprisingly showed, the function of the capacitive switching area is not substantially impaired by spatial proximity between electrically conductive layer 6 and heating wire 21. This result was unexpected and surprising for the person skilled in the art.

In an advantageous embodiment, at least one heating wire 21 is implemented curved, wound, lengthened meanderingly, in a zigzag or otherwise, at least in one subregion of the projection of the electrically conductive layer 6. This has the particular advantage that, in this section of the heating wire 21, the composite pane 100 can be more strongly heated. Thus, the position of the capacitive switching region 10 and in particular of the contact region 11 can be deiced or cleared of condensation particularly quickly and the position of the capacitive switching region 10 is quickly and simply identifiable for the user. Moreover, the asymmetry of the capacitive switching sensitivity is reinforced by this embodiment.

FIG. 3 depicts an improvement of a composite pane 100 according to the invention of FIG. 2B. In this example, additional shield wires 25 were placed between the carrier film 5 and the first intermediate layer 3, in a region that results from projection of the contact region 11 onto the first intermediate layer 3. By means of the shield wires 25, the asymmetry of the capacitive switching sensitivity is reinforced although the shield wires 25 need not be connected either to the heating circuit nor to the sensor electronics system 14. The shield wires 25 can consist of wire sections electrically isolated from one another or of one or a plurality of, for example, wound or meandering wires, Of course, the shield wires 25 can also be electrically connected on one side or both sides to the reference ground or to the heating wires 21.

Of course, the shield wires 25 can also be positioned on the same level as the heating wires 21. For this, for example, the heating wires 21 can be arranged between the substrate 1 and the first intermediate layer 3, as is depicted, for example, in FIG. 2D. This is particularly advantageous and simple to realize from a production technology standpoint. FIG. 4 depicts a flowchart of an exemplary embodiment of the method according to the invention for producing a composite pane 100 with a capacitive switching region 10.

LIST OF REFERENCE CHARACTERS 1 substrate
2 second intermediate layer
3 first intermediate layer
4 cover pane
5 carrier film
6 electrically conductive layer
7 separation line
10 capacitive switching region
11 contact region
12 supply line region
13 connection region
14 capacitive sensor electronics system
15 surrounding region
16 further connection region
17 foil conductor
18 coating-free edge strip
20 electrical line connection
21 heating wire
22 busbar
23 supply line of the busbar 22
24 power supply
25 shield wire
100 composite pane
101 pane arrangement
A area of the contact region 11
$b_A$ width of the connection region 13
$b_B$ width of the contact region 11
$b_z$ width of the supply line region 12
$c_P, c_A, c_{1\ldots 5}$ surface capacitance
$C_{1\ldots 5}$ capacitance
$d_1, d_2, d_3, d_4, d_5$ thickness
$\varepsilon_0$ electric field constant
$\varepsilon_{r,1}, \varepsilon_{r,2}, \varepsilon_{r,3}, \varepsilon_{r,4}, \varepsilon_{r,5}$ relative permittivity
$l_A$ length of the connection region 13
$l_B$ length of the contact region 11
$l_Z$ length of the supply line region 12
r distance from the edge
$t_1$ width of the separation line 7
A-A' section line
B-B' section line
I outer surface of the cover pane 4
IV outer surface of the substrate 1

The invention claimed is:

1. A pane arrangement, comprising:
   a sensor electronics system, and a heatable composite pane having a capacitive switching region, including:
      a substrate and a cover pane, and
      a first intermediate layer arranged between the substrate and the cover pane,
      wherein a carrier film having an electrically conductive layer is arranged between the substrate and the first intermediate layer or between the cover pane and the first intermediate layer at least in sections,
      wherein a region of the electrically conductive layer forms the capacitive switching region,
      wherein the capacitive switching region has a contact region, a supply line region, and a connection region,
      wherein the supply line region electrically connects the contact region to the connection region and the connection region is electrically connectable to the sensor electronics system,
      wherein one or more heating wires and two or more busbars are arranged between the substrate and the cover pane,
      wherein one end of the one or more heating wires is electrically connected to a busbar of the two or more busbars, such that upon application of an electrical voltage to the two or more busbars, a heating current can flow through the one or more heating wires, thereby heating the one or more heating wires,
      wherein the sensor electronics system is electrically connected to the connection region via a first input and to the one or more heating wires or to the two or more busbars via a second input, and
      wherein the capacitive switching region in projection through the composite pane overlaps with a wire of the one or more heating wires.

2. The pane arrangement according to claim 1, wherein the second input of the sensor electronics system is connected to an electrical ground.

3. The pane arrangement according to claim 1, wherein the one or more heating wires and the two or more busbars are arranged between the first intermediate layer and the cover pane.

4. The pane arrangement according to claim 1, wherein a minimum distance of an edge of the carrier film from one side edge of the substrate or from one side edge of the cover pane is greater than or equal to 5 mm.

5. The pane arrangement according to claim 1, wherein a second intermediate layer is arranged between the substrate and the carrier film with the electrically conductive layer.

6. The pane arrangement according to claim 1, wherein the one or more heating wires includes a metal, and has an electrically insulating sheathing.

7. The pane arrangement according to claim 1, wherein the supply line region has a length of 1 cm to 70 cm and has a width of 0.5 mm to 10 mm.

8. The pane arrangement according to claim 1, wherein an area of the contact region is from 1 cm$^2$ to 200 cm$^2$, and has a rectangular, square, trapezoidal, triangular, circular, elliptical, or drop- shaped form or is formed with rounded corners.

9. The pane arrangement according to claim 1, wherein the first intermediate layer and/or a second intermediate layer, arranged between the substrate and the carrier film with the electrically conductive layer, is transparent, contains or is made of polyvinyl butyral (PVB), and/or has a relative permittivity $\varepsilon_{r,2/3}$ of 2 to 4 and the carrier film is transparent, contains or is made of polyethylene terephthalate (PET), and/or has a relative permittivity $\varepsilon_{r,5}$ of 2 to 4.

10. The pane arrangement according to claim 1, wherein the substrate and/or the cover pane contains glass, or polymers, and/or mixtures thereof.

11. The pane arrangement according to claim 1, wherein the electrically conductive layer is transparent and/or has a sheet resistance of 0.4 ohm/square to 200 ohm/square and/or contains silver (Ag), indium tin oxide (ITO), fluorine-doped tin oxide (SnO$_2$:F), or aluminum doped zinc oxide (ZnO:Al).

12. The pane arrangement according to claim 1, wherein a sensitivity of the sensor electronics system is selected such that it outputs a switching signal upon contact of the contact region with a human finger on an outer surface of the substrate and outputs no switching signal or a different switching signal upon contact of the contact region on an outer surface of the cover pane.

13. The pane arrangement according to claim 1, wherein a sensitivity of the sensor electronics system is selected such that it outputs a switching signal upon contact of the contact region on an outer surface of the substrate and/or on an outer surface of the cover pane with a human finger and outputs no switching signal or a different switching signal upon contact of the supply line region on the outer surface of the substrate and/or on the outer surface of the cover pane.

14. A method for producing a capacitive composite pane, comprising:
    providing a first intermediate layer, a transparent electrically conductive later, a carrier film, two busbars, one or more heating wires, and a cover pane;
    cutting the first intermediate layer to size;
    applying the transparent, electrically conductive layer on a surface of one side of the carrier film by cathodic sputtering;
    applying the two busbars on a surface of the first intermediate layer;
    applying the one or more heating wires on the surface of the first intermediate layer such that the one or more heating wires is electrically connected to both of the two busbars;
    producing a stack sequence of the substrate, the first intermediate layer with the one or more heating wires and with the two busbars, the carrier film with the electrically conductive layer, and the cover pane; and
    laminating the stack sequence to form the capacitive composite pane.

15. A method of using a pane arrangement, comprising:
    attaching a pane arrangement according to claim 1 in means of transportation for travel on land, in air or on water.

16. The pane arrangement according to claim 1, wherein a minimum distance of an edge of the carrier film from one side edge of the substrate or from one side edge of the cover pane is greater than or equal to 15 mm.

17. The pane arrangement according to claim 1, wherein the supply line region has a length of 1 cm to 8 cm, a width of 0.5 mm to 2 mm, a shape of rectangle, a strip, or a line, and wherein the ratio of the length to the width of the supply line region is from 1:5 to 1:100.

18. The pane arrangement according to claim 1, wherein an area of the contact region is from 1 cm$^2$ to 9 cm$^2$, and/or has a rectangular, square, trapezoidal, triangular, circular, elliptical, or drop-shaped form or has a shape with rounded corners.

19. The pane arrangement according to claim 1, wherein the first intermediate layer and/or a second intermediate layer, arranged between the substrate and the carrier film with the electrically conductive layer, is transparent, contains or is made of polyvinyl butyral (PVB), and/or has a relative permittivity $\varepsilon_{r,2/3}$ of 2.1 to 2.9 and the carrier film is transparent, contains or is made of polyethylene terephthalate (PET), and/or has a relative permittivity $\varepsilon_{r,5}$ of 2.7 to 3.3.

* * * * *